(12) United States Patent
Hussein et al.

(10) Patent No.: US 8,994,147 B2
(45) Date of Patent: Mar. 31, 2015

(54) SEMICONDUCTOR DEVICE AND SEMICONDUCTOR ELEMENT

(75) Inventors: Khalid Hassan Hussein, Tokyo (JP); Shoji Saito, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/370,858

(22) Filed: Feb. 10, 2012

(65) Prior Publication Data

US 2012/0286288 A1 Nov. 15, 2012

(30) Foreign Application Priority Data

May 11, 2011 (JP) .................................. 2011-106529

(51) Int. Cl.
*H01L 27/082* (2006.01)
*H01L 29/739* (2006.01)
(Continued)

(52) U.S. Cl.
CPC ........ *H01L 29/7397* (2013.01); *H01L 27/0207* (2013.01); *H01L 27/0211* (2013.01); *H01L 29/0696* (2013.01); *H01L 29/0834* (2013.01); *H01L 29/1095* (2013.01); *H01L 29/167* (2013.01); *H01L 27/082* (2013.01); *H01L 27/088* (2013.01); *H01L 29/1602* (2013.01);
(Continued)

(58) Field of Classification Search
CPC ............ H01L 27/0207; H01L 27/0211; H01L 27/082; H01L 27/088; H01L 27/0823
See application file for complete search history.

(56) References Cited

U.S. PATENT DOCUMENTS 4,356,408 A * 10/1982 Glennon ........................ 327/405
5,341,004 A * 8/1994 Furuhata ....................... 257/139
(Continued)

FOREIGN PATENT DOCUMENTS

JP 4-280475 10/1992
JP 5-283676 10/1993
(Continued)

OTHER PUBLICATIONS

Korean Office Action issued Jul. 28, 2013, in Korea Patent Application No. 10-2012-0047887 (with partial English translation).
(Continued)

*Primary Examiner* — Zandra Smith
*Assistant Examiner* — Molly Reida
(74) *Attorney, Agent, or Firm* — Oblon, McClelland, Maier & Neustadt, L.L.P.

(57) ABSTRACT

A semiconductor device includes a semiconductor element including a first element portion having a first gate and a second element portion having a second gate, wherein the turning on and off of the first and second element portions are controlled by a signal from the first and second gates respectively. The semiconductor device further includes signal transmission means connected to the first gate and the second gate and transmitting a signal to the first gate and the second gate so that when the semiconductor element is to be turned on, the first element portion and the second element portion are simultaneously turned on, and so that when the semiconductor element is to be turned off, the second element portion is turned off a delay time after the first element portion is turned off.

8 Claims, 11 Drawing Sheets

(51) Int. Cl.
*H01L 27/02* (2006.01)
*H01L 29/06* (2006.01)
*H01L 29/08* (2006.01)
*H01L 29/10* (2006.01)
*H01L 29/167* (2006.01)
*H01L 27/088* (2006.01)
*H01L 29/16* (2006.01)
*H01L 29/20* (2006.01)
*H03K 17/16* (2006.01)
*H03K 17/687* (2006.01)

(52) U.S. Cl.
CPC ......... *H01L29/1608* (2013.01); *H01L 29/2003* (2013.01); *H03K 17/163* (2013.01); *H03K 2017/6878* (2013.01)
USPC ........... 257/566; 257/578; 257/579; 257/368; 257/378; 257/401; 307/125; 307/126; 307/130; 327/392; 327/401; 327/403

(56) References Cited

U.S. PATENT DOCUMENTS

| | | | |
|---|---|---|---|
| 5,459,339 | A | 10/1995 | Sakurai et al. |
| 5,561,393 | A | 10/1996 | Sakurai et al. |
| 2007/0210350 | A1* | 9/2007 | Omura et al. .................. 257/287 |
| 2009/0296441 | A1* | 12/2009 | Klemt et al. .................. 363/131 |
| 2012/0098097 | A1* | 4/2012 | Felsl et al. .................... 257/566 |

FOREIGN PATENT DOCUMENTS

| | | |
|---|---|---|
| JP | 7-321304 A | 12/1995 |
| JP | 2000-101076 A | 4/2000 |
| JP | 2004-319624 A | 11/2004 |
| JP | 2007-273931 A | 10/2007 |
| JP | 2010-182985 A | 8/2010 |
| WO | WO 2011/033733 | 3/2011 |

OTHER PUBLICATIONS

Korean Office Action issued Feb. 19, 2014 in Patent Application No. 10-2012-0047887 with Partial English Translation.
Office Action issued Aug. 11, 2014 in German Patent Application No. 10 2012 203 595.8 (with English language translation).
Office Action issued Jun. 10, 2014, in Japanese Patent Application No. 2011-106529 with partial English translation.
Chinese Office Action issued Apr. 30, 2014, in China Patent Application No. 201210196246.1 (with Partial English translation).
Office Action dated Dec. 10, 2014 in Chinese Application No. 201210196246.1, along with a partial English translation.

* cited by examiner

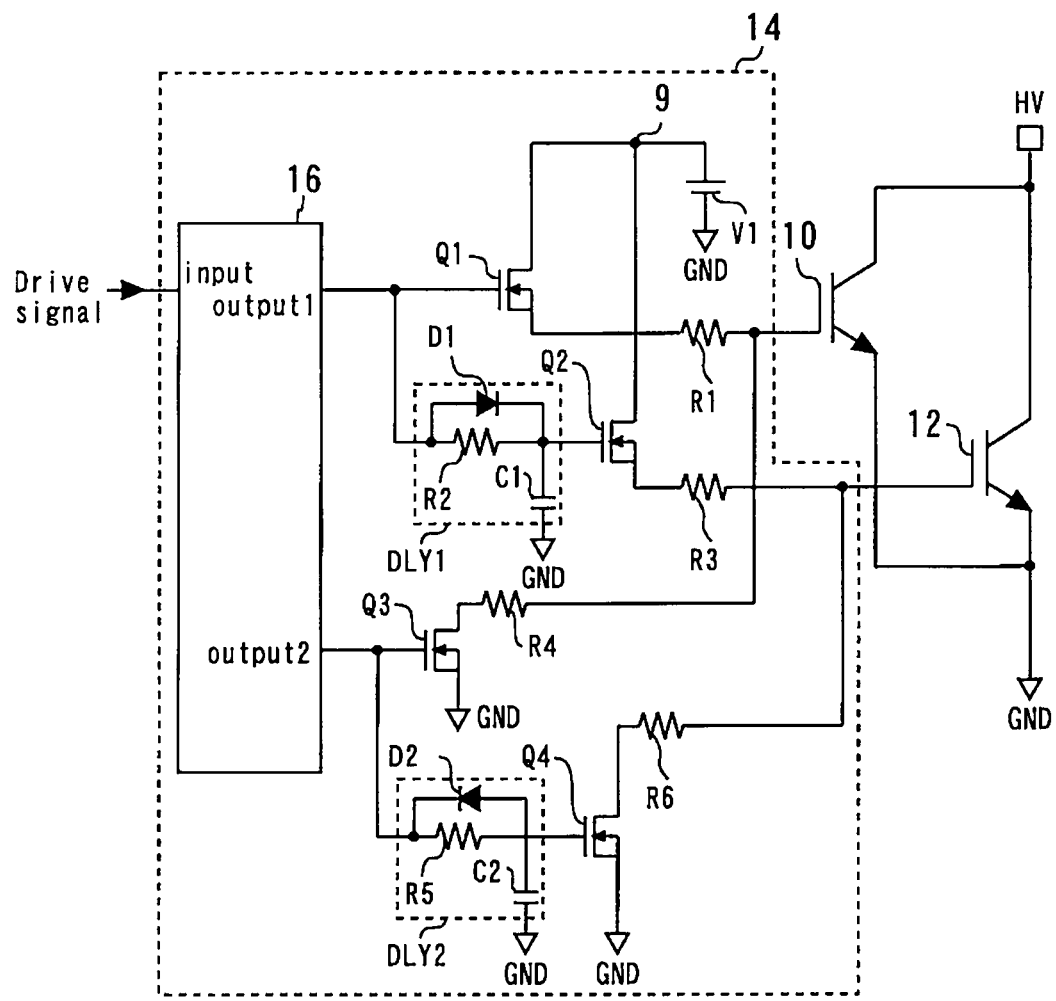
F I G. 1

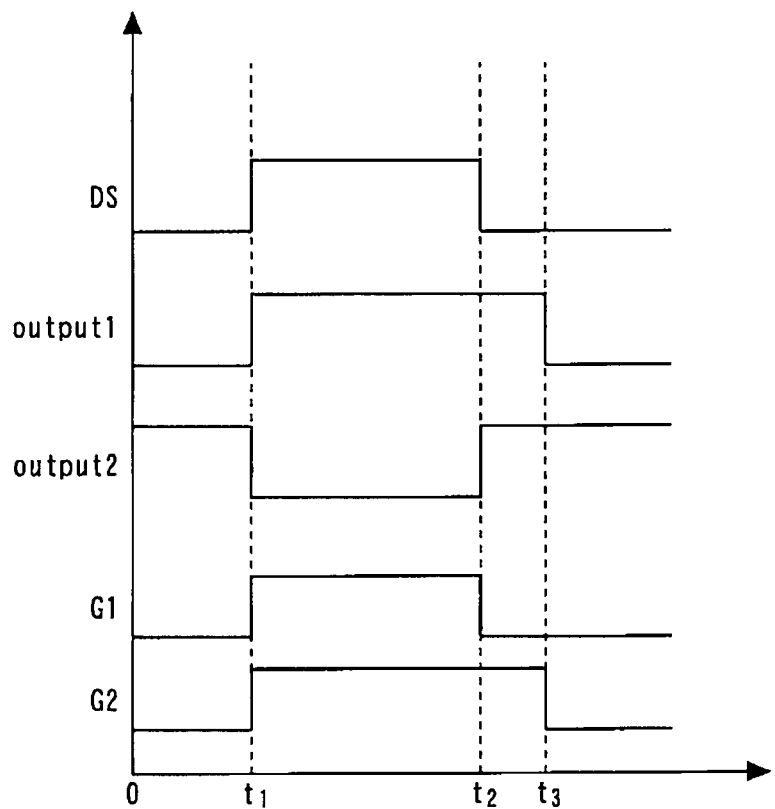
F I G. 4
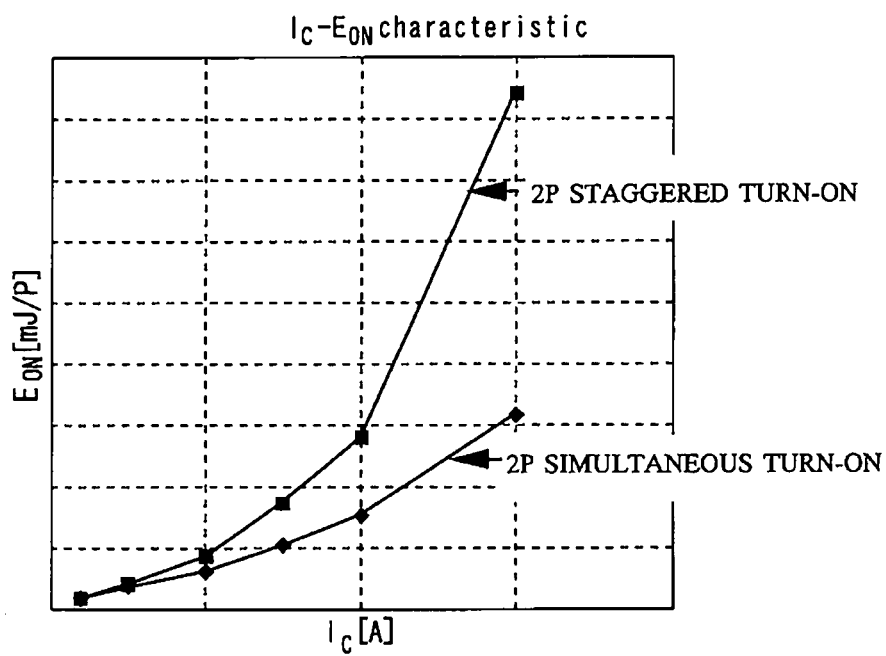
F I G. 5

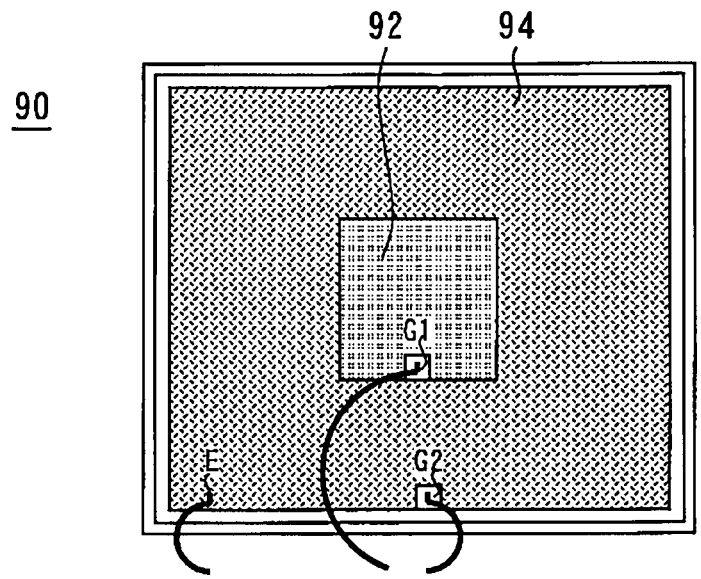
F I G. 1 2
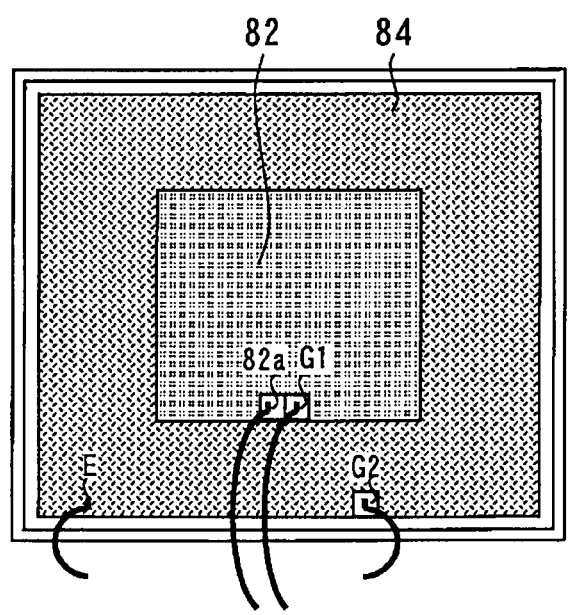
F I G. 1 3

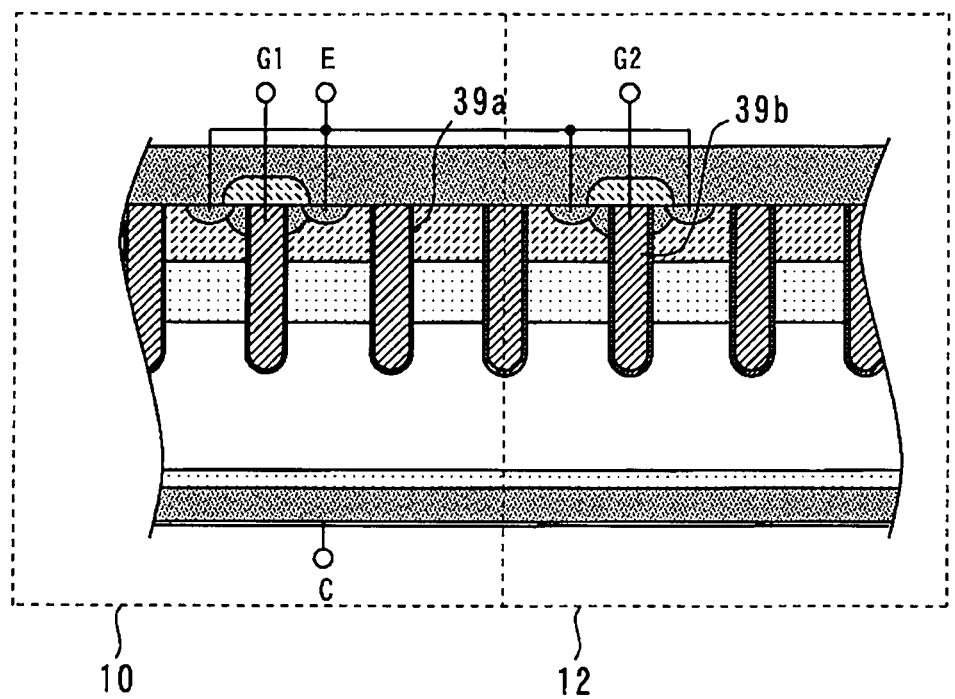
F I G. 1 9
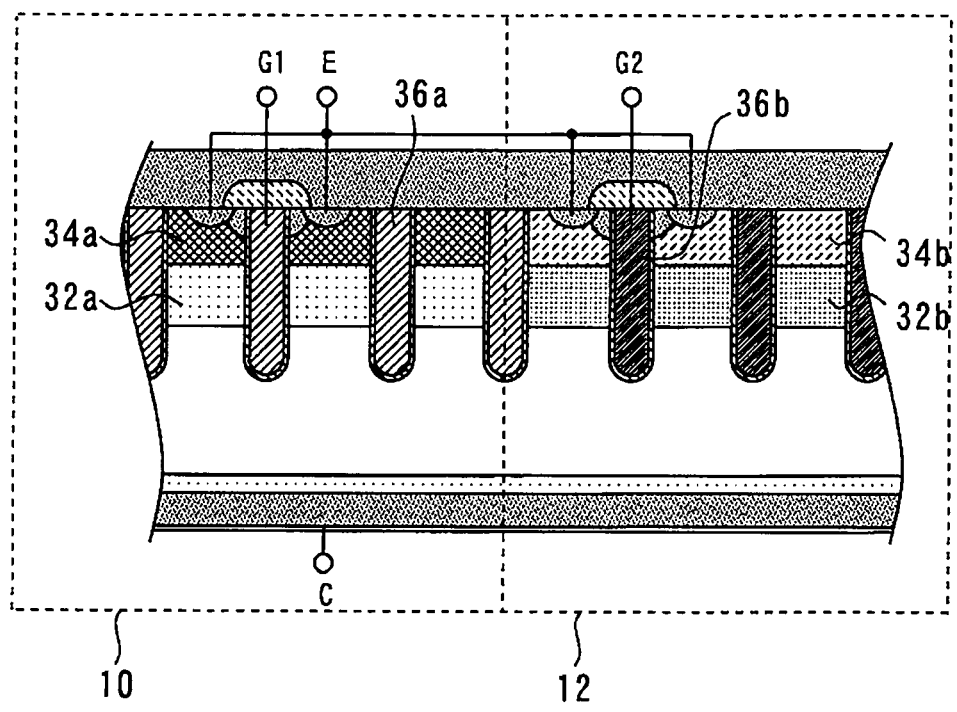
F I G. 2 0

SEMICONDUCTOR DEVICE AND SEMICONDUCTOR ELEMENT

BACKGROUND OF THE INVENTION

1. Field of the Invention

The present invention relates to a semiconductor device and a semiconductor element which are used, e.g., for power control.

2. Background Art

Japanese Laid-Open Patent Publication No. H04-280475 discloses a semiconductor device including a semiconductor element that is turned on and off by the presence or absence of a voltage at its gate.

When a semiconductor element is turned on and off, switching loss occurs. In order to reduce the total switching loss of the semiconductor element, it is necessary to reduce both the turn-on loss and the turn-off loss of the element (which constitute the switching loss). In the case of conventional semiconductor elements, however, there is a trade-off between the turn-on loss and the turn-off loss, making it impossible to reduce the total switching loss.

SUMMARY OF THE INVENTION

The present invention has been made to solve this problem. It is, therefore, an object of the present invention to provide a semiconductor device and a semiconductor element which have reduced switching loss.

According to one aspect of the present invention, a semiconductor device includes a semiconductor element includes a first element portion having a first gate and a second element portion having a second gate, wherein the turning on and off of the first element portion is controlled by a signal from the first gate, and wherein the turning on and off of the second element portion is controlled by a signal from the second gate, and signal transmission means connected to the first gate and the second gate and transmitting a signal to the first gate and the second gate so that when the semiconductor element is to be turned on, the first element portion and the second element portion are simultaneously turned on, and so that when the semiconductor element is to be turned off, the second element portion is turned off a delay time after the first element portion is turned off.

According to another aspect of the present invention, a semiconductor device includes a semiconductor element including a plurality of element portions, each having a separate gate formed thereon, and signal transmission means connected to all of the gates of the semiconductor element and adapted to simultaneously turn on all of the plurality of element portions when the semiconductor element is to be turned on, and also adapted to sequentially turn off the plurality of element portions when the semiconductor element is to be turned off.

According to another aspect of the present invention, a semiconductor element includes a first element portion wherein the turning on and off of the first element portion is controlled by a signal from a first gate, and a second element portion wherein the turning on and off of the second element portion is controlled by a signal from a second gate and wherein the operation of the second element portion is delayed with respect to the first element portion.

Other and further objects, features and advantages of the invention will appear more fully from the following description.

BRIEF DESCRIPTION OF THE DRAWINGS

FIG. 1 is a circuit diagram showing a semiconductor device in accordance with a first embodiment of the present invention;

FIG. 4 is a timing chart showing the operation of the semiconductor device of the first embodiment;

FIG. 5 is a diagram showing the turn-on loss of the semiconductor device in two different operating conditions;

FIG. 12 is a diagram showing a variation of the semiconductor element of the third embodiment;

FIG. 13 is a diagram showing another variation of the semiconductor element of the third embodiment;

FIG. 19 is a diagram showing a variation of the semiconductor element of the fifth embodiment; and FIG. 20 is a cross-sectional view of the semiconductor element of the sixth embodiment.

DETAILED DESCRIPTION OF THE PREFERRED EMBODIMENTS

First Embodiment

Figure 2:
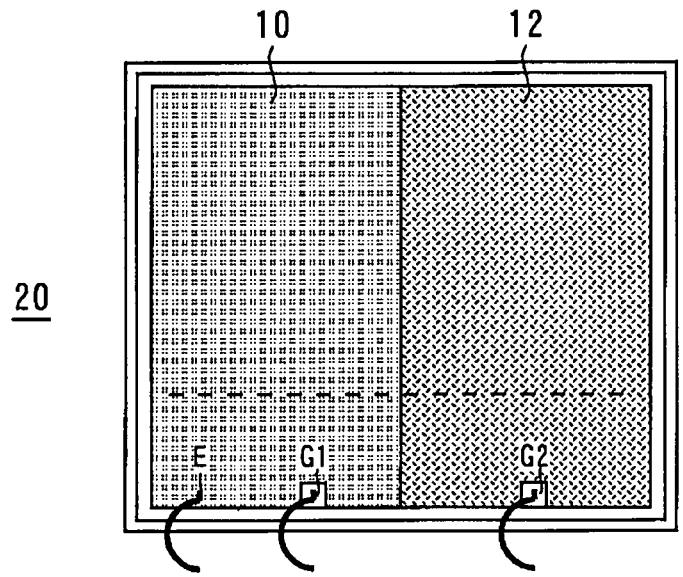
FIG. 2 is a diagram showing the semiconductor element of the semiconductor device of the first embodiment.

FIG. 1 is a circuit diagram showing a semiconductor device in accordance with a first embodiment of the present invention. The semiconductor device of the first embodiment includes a first element portion 10 and a second element portion 12. The first and second element portions 10 and 12 together form a single semiconductor element. The gate of the first element portion 10 and the gate of the second element portion 12 are connected to a signal transmission means 14. (The gates of the first and second element portions 10 and 12 are hereinafter referred to as the first gate and the second gate, respectively.) The signal transmission means 14 transmits signals to the first gate and the second gate separately.

The signal transmission means 14 includes an IC 16 for receiving a drive signal. The IC 16 outputs a signal from an output 1 and an output 2 thereof in accordance with the received drive signal. The signal output from the output 1 turns on switches Q1 and Q2 and thereby turns on the first element portion 10 and the second element portion 12. The signal output from the output 2 turns on switches Q3 and Q4 and thereby turns off the first element portion 10 and the second element portion 12.

FIG. 2 is a diagram showing the semiconductor element 20 of the semiconductor device of the first embodiment. The semiconductor element 20 is formed by the first element portion 10 and the second element portion 12, which are formed on a single chip. The element area of the first element portion 10 is equal to that of the second element portion 12. The first element portion 10 is turned on and off by the signal from the first gate (G1). The second element portion 12 is turned on and off by the signal from the second gate (G2). That is, the first element portion 10 and the second element portion 12 are controlled by different signals.

Figure 3:
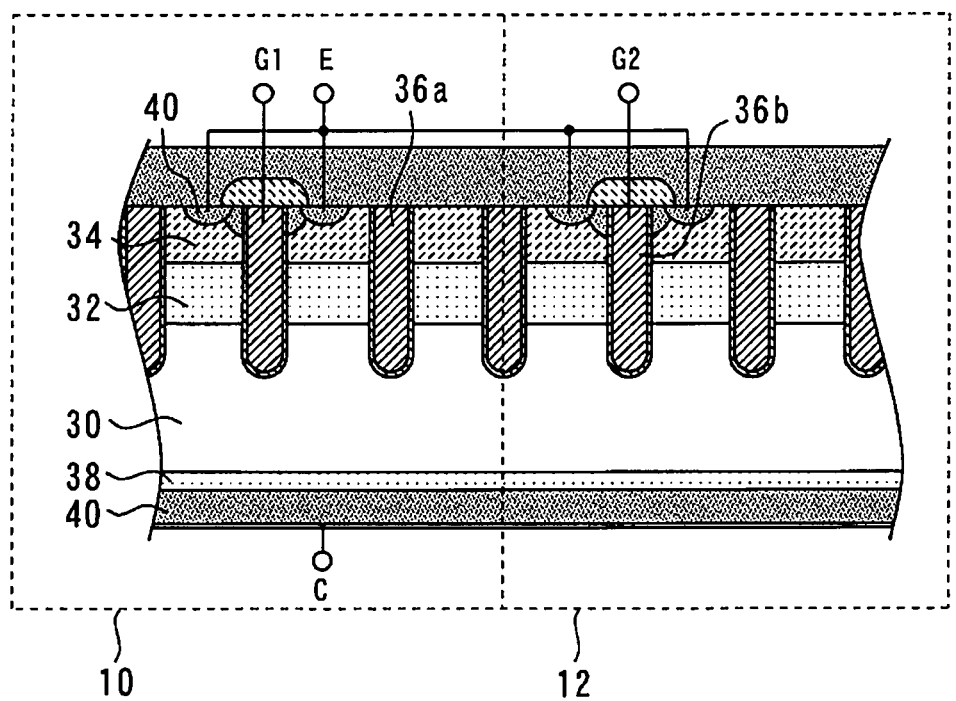
FIG. 3 is a cross-sectional view taken along dashed line of FIG. 2.

FIG. 3 is a cross-sectional view taken along dashed line of FIG. 2. The uppermost surface structures of the gates, etc. are shown simplified in FIG. 3. The semiconductor element 20 is an IGBT. The semiconductor element 20 includes an n$^-$-layer (or drift layer) 30. A base layer 32 and a channel layer 34 are formed on the top surface of the n$^-$-layer 30 in the order named. In the first element portion 10, polysilicon gates 36a are formed to penetrate through the base layer 32 and the channel layer 34. The polysilicon gates 36a are connected to the first gate (G1). In the second element portion 12, polysilicon gates 36b are formed to penetrate through the base layer 32 and the channel layer 34. The polysilicon gates 36b are connected to the second gate (G2). A buffer layer 38 and a collector layer 40 are formed on the bottom surface of the n$^-$-layer 30 in the order named.

The operation of the semiconductor device of the first embodiment will now be described. FIG. 4 is a timing chart showing the operation of the semiconductor device of the first embodiment. Time t1 is the time when the semiconductor element 20 is first turned on. Specifically, at time t1, an external drive signal (DS) is transmitted to the IC 16. In response, the IC 16 outputs a signal from the output 1 thereof so as to simultaneously change the signals at the first gate (G1) and the second gate (G2) to a HIGH level. As a result, the first element portion 10 and the second element portion 12 are turned on concurrently.

Time t2 is the time when the first element portion 10 is subsequently turned off. Specifically, at time t2, the external drive signal (DS) to the IC 16 is interrupted. In response, the IC 16 outputs a signal from the output 2 thereof so as to change the signal at the first gate (G1) to a LOW level. As a result, the first element portion 10 is turned off.

Both the output 1 and the output 2 of the IC 16 output a signal during the period from time t2 to time t3. However, the switch Q4 is off during this period, since the signal from the output 2 is delayed in reaching the switch Q4 by a delay circuit DLY2. As a result, the second element portion 12 is maintained in its on-state during this period.

The second element portion 12 is turned off at time t3. Specifically, at time t3, the signal from the output 1 is interrupted, and the second element portion 12 is turned off by the delayed signal from the output 2. Thus, both the first element portion 10 and the second element portion 12 are turned off at time t3, completing the turn off of the semiconductor element 20.

Thus, the semiconductor element 20 is turned on by turning on the first element portion 10 and the second element portion 12 simultaneously. On the other hand, the semiconductor element 20 is turned off by first turning off the first element portion 10 and then, after a delay, turning off the second element portion 12.

The semiconductor device of the first embodiment is adapted to exhibit reduced switching loss both when it turns on and when it turns off. First the switching loss occurring in the semiconductor device when the device turns on (referred to as the turn-on loss) will be described. FIG. 5 is a diagram showing the turn-on loss of the semiconductor device in two different operating conditions. In FIG. 5, the term "2P SIMULTANEOUS TURN-ON" indicates that the first element portion 10 and the second element portion 12 are simultaneously turned on. The term "2P STAGGERED TURN-ON" indicates that either the first element portion 10 or the second element portion 12 is turned on a delay time after the other is turned on.

FIG. 5 shows that the turn-on loss of the semiconductor device in the 2P SIMULTANEOUS TURN-ON operation mode is lower than that in the 2P STAGGERED TURN-ON operation mode. It should be noted that the larger the element area used when the semiconductor element is turned on, the lower the turn-on loss. In the semiconductor device of the first embodiment, the areas of both the first and second element portions 10 and 12 are used when the semiconductor element is turned on (since these element portions are simultaneously turned on), resulting in reduced turn-on loss.

Figure 6:
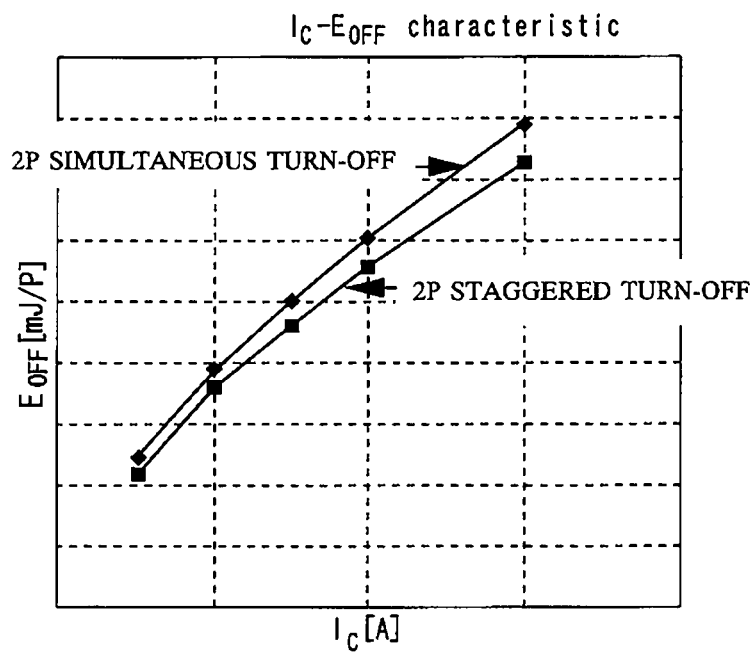
FIG. 6 is a diagram showing the turn-off loss of the semiconductor device in two different operating conditions.

The switching loss occurring in the semiconductor device when the device turns off (referred to as the turn-off loss) will now be described. FIG. 6 is a diagram showing the turn-off loss of the semiconductor device in two different operating conditions. In FIG. 6, the term "2P SIMULTANEOUS TURN-OFF" indicates that the first element portion 10 and the second element portion 12 are simultaneously turned off. The term "2P STAGGERED TURN-OFF" indicates that the second element portion 12 is turned off a delay time after the first element portion 10 is turned off.

FIG. 6 shows that the turn-off loss of the semiconductor device in the 2P STAGGERED TURN-OFF operation mode is lower than that in the 2P SIMULTANEOUS TURN-OFF operation mode. In the case of the 2P STAGGERED TURN-OFF operation mode; the semiconductor device (or element) is turned off using substantially only the second element portion 12. This means that the element area used when the semiconductor element is turned off in the 2P STAGGERED TURN-OFF operation mode is smaller than that used when the semiconductor element is turned off in the 2P SIMULTANEOUS TURN-OFF operation mode. It should be noted that the smaller the element area used when the semiconductor element is turned off, the lower the turn-off loss. In the case of the semiconductor device of the first embodiment, the device is turned off by first turning off the first element portion 10 and then, after a delay, turning off the second element portion 12, resulting in reduced turn-off loss.

Figure 7:
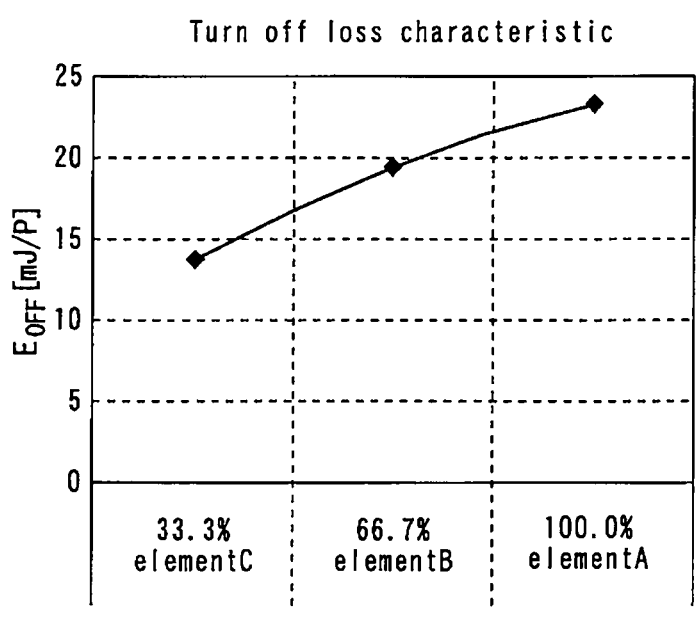
FIG. 7 is a diagram showing the relationship between the turn-off loss and the element area.

FIG. 7 is a diagram showing the relationship between the turn-off loss and the element area. This curve was determined by measuring the turn-off losses of three elements, namely, an element A, an element B, and an element C. The area of the element B is 66.7% of the area of the element A, and the area of the element C is 33.3% of the area of the element A. As can be seen from FIG. 7, the smaller the element area, the lower the turn-off loss (EOFF). Therefore, the turn-off loss of a semiconductor element can be reduced by reducing its element area.

Thus the construction of the semiconductor device of the first embodiment enables reduction of both the turn-on loss and the turn-off loss, making it possible to reduce the total switching loss in the device.

Various alterations may be made to the semiconductor device of the first embodiment. For example, although in the first embodiment the semiconductor element 20 is divided into two element portions, namely, the first element portion 10 and the second element portion 12, it is to be understood that the semiconductor element may be divided into three or more element portions each having a separate gate formed thereon. In such cases, the semiconductor element is turned on by turning on all element portions simultaneously, and is turned off by turning off the element portions sequentially.

Figure 8:
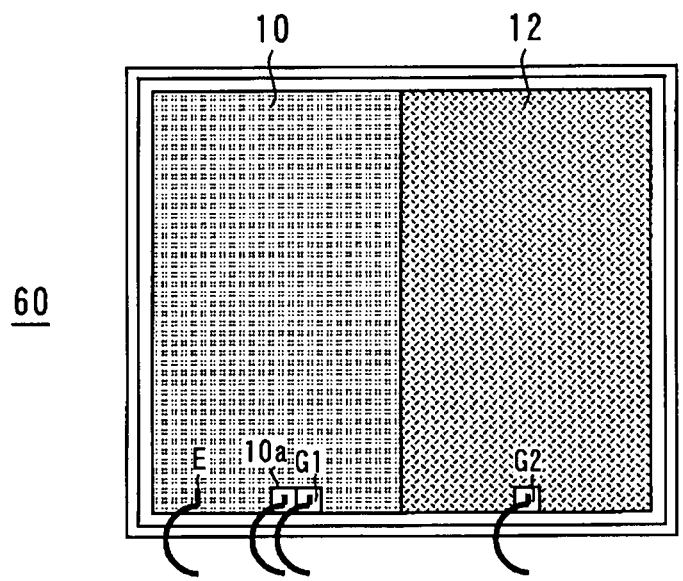
FIG. 8 is a diagram showing a variation of the semiconductor device of the first embodiment.

FIG. 8 is a diagram showing a variation of the semiconductor device of the first embodiment. In the semiconductor element 60 shown in FIG. 8, a sense pad 10a is formed on the first element portion 10. The sense pad 10a can be used to check the presence of a short circuit in the semiconductor element during the turn-on operation, thereby providing overcurrent protection.

Second Embodiment

Figure 9:
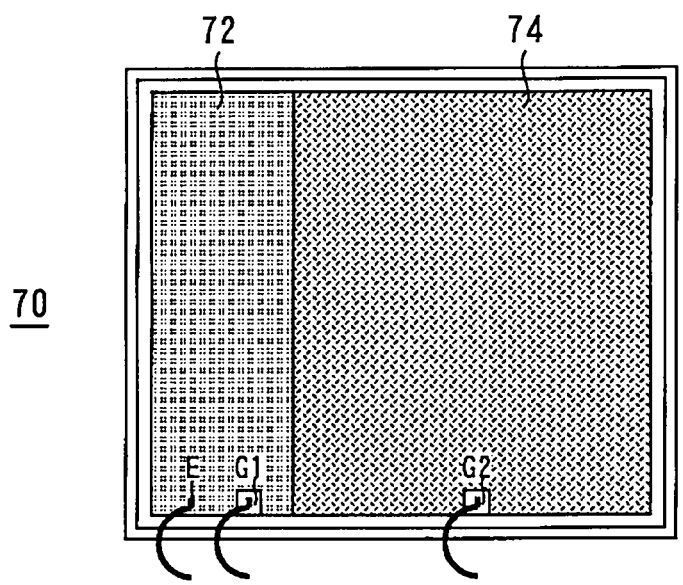
FIG. 9 is a diagram showing the semiconductor element of a semiconductor device in accordance with a second embodiment of the present invention.

FIG. 9 is a diagram showing the semiconductor element 70 of a semiconductor device in accordance with a second embodiment of the present invention. The semiconductor element 70 has a first element portion 72 and a second element portion 74. The second element portion 74 is formed to be greater in area than the first element portion 72. Components of the semiconductor device which are not shown in FIG. 9 are identical to those of the semiconductor device of the first embodiment. Further, the operation of this semiconductor device is also similar to that of the semiconductor device of the first embodiment.

It has been found in some cases that when the semiconductor element of the first embodiment turns off, the current density in the second element portion increases to such an extent as to degrade the portion. In the case of the semiconductor element of the second embodiment, however, the increase in current density of the second element portion 74 when the element is turned off is not significant, since the area of the second element portion 74 is relatively large, thus preventing the degradation of the second element portion 74. Further, the construction of the semiconductor device of the second embodiment, like that of the first embodiment, enables reduction of the switching loss in the device. It should be noted that the semiconductor element of the second embodiment is susceptible of at least alterations similar to those that can be made to the semiconductor element of the first embodiment.

Third Embodiment

Figure 10:
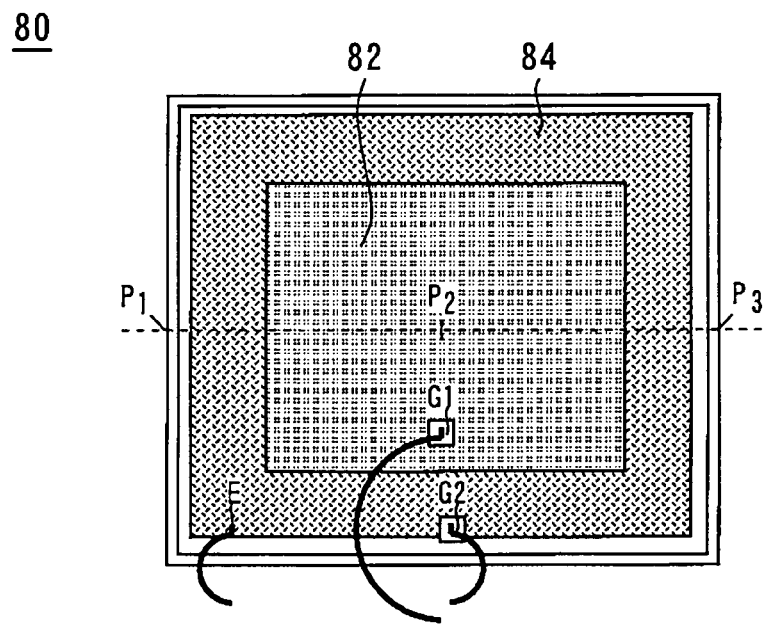
FIG. 10 is a diagram showing the semiconductor element of a semiconductor device in accordance with a third embodiment of the present invention.

FIG. 10 is a diagram showing the semiconductor element 80 of a semiconductor device in accordance with a third embodiment of the present invention. The semiconductor element 80 has a first element portion 82 and a second element portion 84. The second element portion 84 is formed to surround the first element portion 82. The area of the first element portion 82 is equal to that of the second element portion 84. Components of the semiconductor device which are not shown in FIG. 10 are identical to those of the semiconductor device of the first embodiment. Further, the operation of this semiconductor device is also similar to that of the semiconductor device of the first embodiment.

A semiconductor element generates heat therein due to, e.g., turn-off loss. The central portion of the semiconductor element tends to be heated to a high temperature, since the heat dissipation from that portion is relatively low. The peripheral portion of the semiconductor element, on the other hand, is unlikely to be heated to a high temperature, since heat can be dissipated from the peripheral portion to the ambient environment. It has been found in some cases that the central portion of the semiconductor element is heated to a high temperature resulting in degradation of the element.

In the case of the semiconductor element 80 of the third embodiment, however, the first element portion 82 (which corresponds to the central portion of the semiconductor element) is turned off before the second element portion 84 is turned off, so that the amount of heat generated from the first element portion 82 is less than that generated from the second element portion 84. This prevents the central portion of the semiconductor element 80 from being heated to a high temperature.

Figure 11:
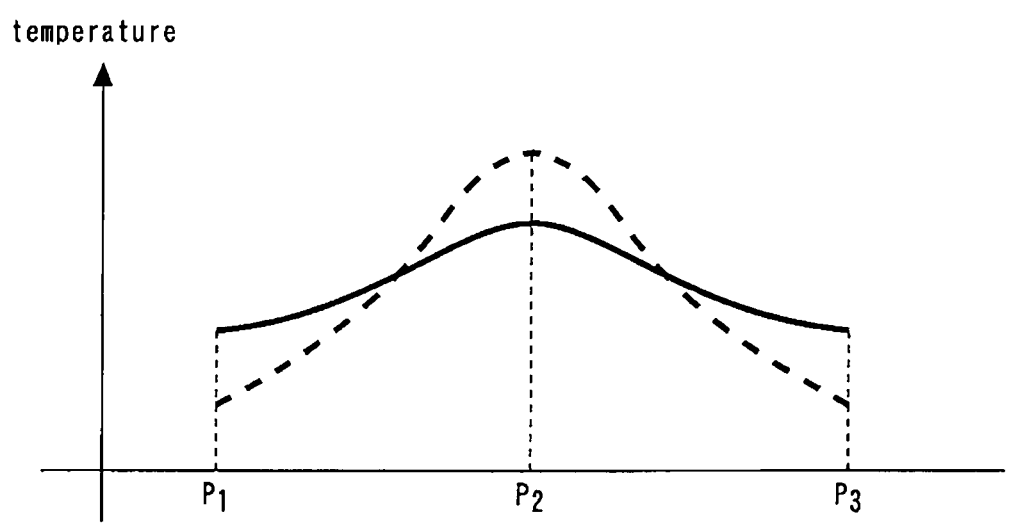
FIG. 11 is a diagram showing the temperature distribution in the semiconductor element along the dashed line of FIG. 10.

FIG. 11 is a diagram showing the temperature distribution in the semiconductor element 80 along the dashed line of FIG. 10. In FIG. 11, the solid line represents the temperature distribution when the second element portion 84 is turned off after the first element portion 82 has been turned off. The dashed line in FIG. 11 represents the temperature distribution when the first element portion 82 and the second element portion 84 are simultaneously turned off. As can be seen from FIG. 11, the temperature of the central portion (P2) of the semiconductor element 80 (which corresponds to the first element portion 82) when the second element portion 84 is turned off after the first element portion 82 has been turned off is lower than that when the first element portion 82 and the second element portion 84 are simultaneously turned off.

FIG. 12 is a diagram showing a variation of the semiconductor element of the third embodiment. This semiconductor element, 90, has a first element portion 92 formed at its central portion. A second element portion 94 is formed along the periphery of the semiconductor element 90. The second element portion 94 is greater in area than the first element portion 92. This further reduces the amount of heat generated from the first element portion 92 and thereby reduces the temperature of the central portion of the semiconductor element 90, as compared with the semiconductor element of the third embodiment. Further, since the area of the second element portion 94 is large, the temperature of this portion can also be reduced.

FIG. 13 is a diagram showing another variation of the semiconductor element of the third embodiment. The first element portion 82 of this semiconductor element has a sense pad 82a formed thereon. The sense pad 82a can be used to check the presence of a short circuit in the semiconductor element during the turn-on operation, thereby providing overcurrent protection. It should be noted that the semiconductor element of the third embodiment is susceptible of at least alterations similar to those that can be made to the semiconductor element of the first embodiment.

Fourth Embodiment

Figure 14:
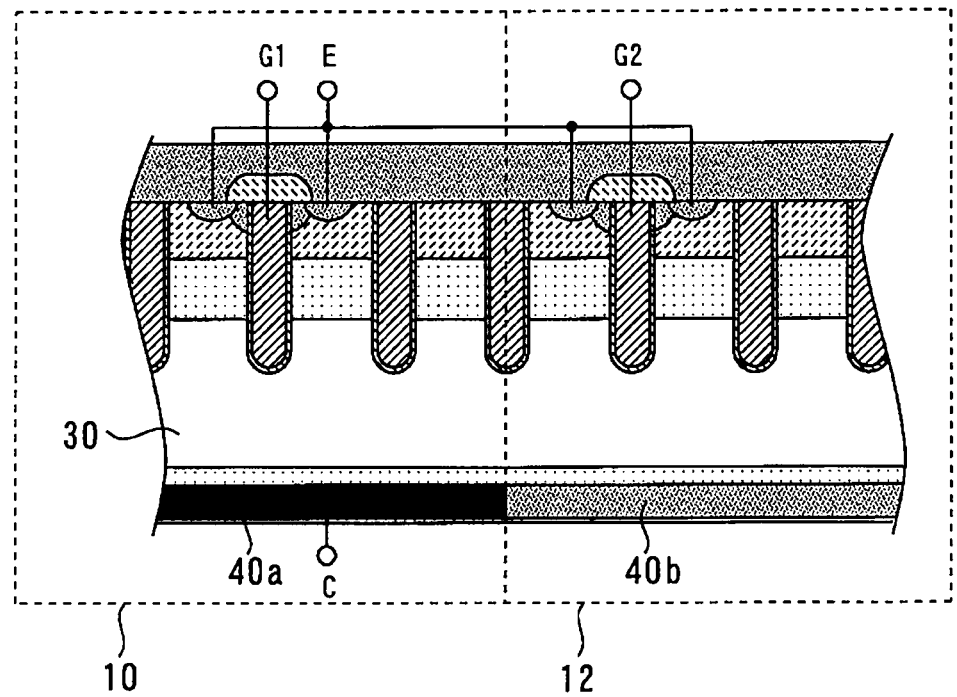
FIG. 14 is a cross-sectional view of the semiconductor element of the fourth embodiment.

A semiconductor element in accordance with a fourth embodiment of the present invention is characterized in that the first and second element portions have different switching speeds. FIG. 14 is a cross-sectional view of the semiconductor element of the fourth embodiment. The semiconductor element is a conductivity modulation type semiconductor element in which carriers are injected from collector layers 40a and 40b into the drift layer 30. The cross-sectional view of FIG. 14 includes collector layers different from that shown in the cross-sectional view of FIG. 3. It should be noted that components of the semiconductor device which are not shown in FIG. 14 are identical to those of the semiconductor device of the first embodiment. Further, the operation of this semiconductor device is also similar to that of the semiconductor device of the first embodiment.

The first collector layer 40a of the first element portion 10 is formed to have a relatively high impurity concentration so that the first element portion 10 meets low-speed specification. The low-speed specification specifies that the steady state loss EVce be low although the turn-off loss Eoff can be relatively high. The second collector layer 40b of the second element portion 12, on the other hand, is formed to have a lower impurity concentration than the first collector layer 40a so that the second element portion 12 meets high-speed specification. The high-speed specification specifies that the turn-off loss Eoff be low although the steady state loss EVce can be relatively high.

Figure 15:
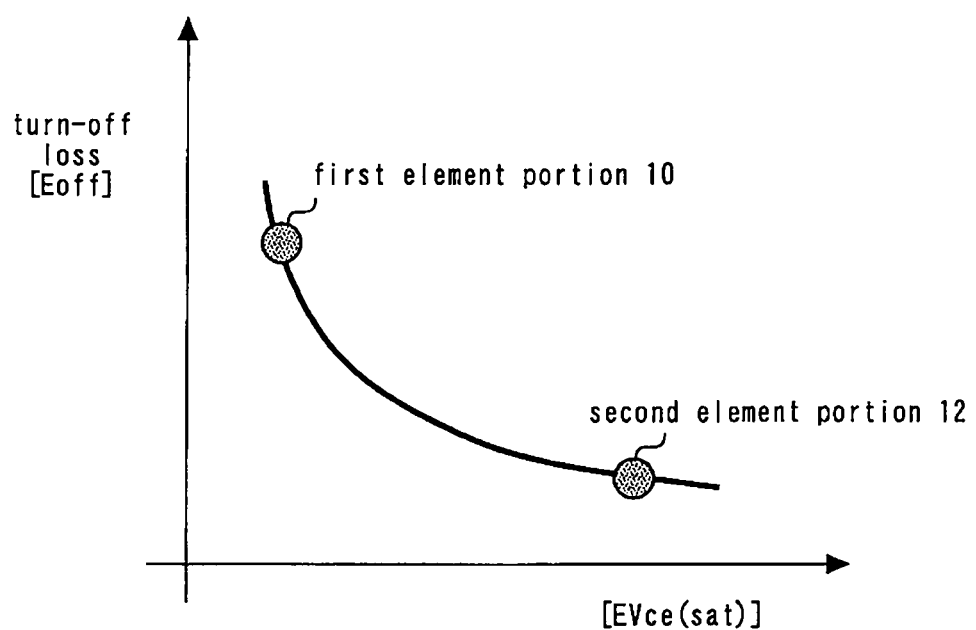
FIG. 15 is a diagram showing the difference between the specification for the first element portion and that for the second element portion.

FIG. 15 is a diagram showing the difference between the specification for the first element portion 10 and that for the second element portion 12. Specifically, the first element portion 10 is designed in accordance with the low-speed specification, and the second element portion 12 is designed in accordance with the high-speed specification. Since the switching speed of the second element portion 12 is higher than that of the first element portion 10, the second element portion 12 exhibits lower turn-off loss (Eoff).

Figure 16:
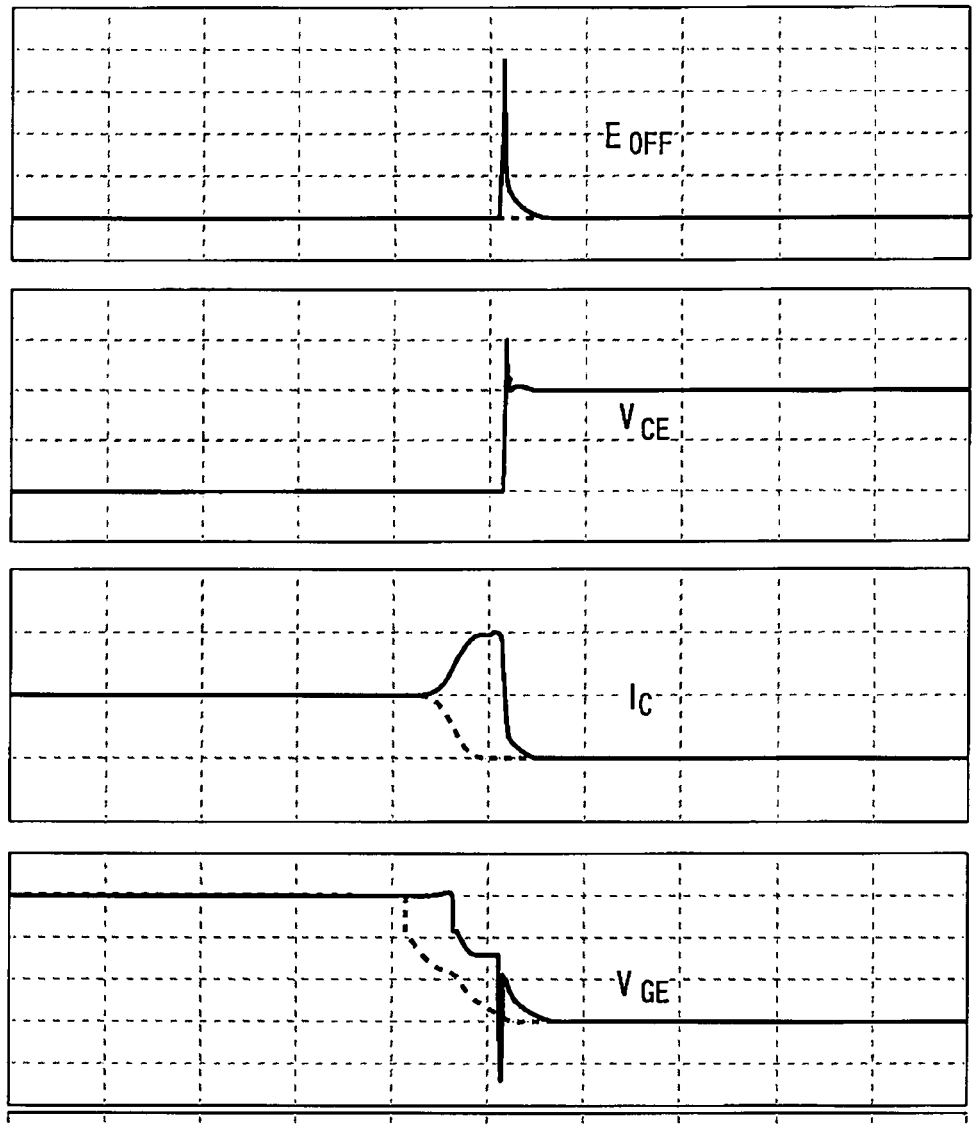
FIG. 16 is a diagram showing simulation results of the turn-off losses (Eoff), etc. in the first and second element portions.

Most of the turn-off loss of the semiconductor device occurs in the second element portion 12, which is turned off a delay time after the first element portion 10 is turned off. FIG. 16 is a diagram showing simulation results of the turn-off losses (Eoff), etc. in the first and second element portions. In FIG. 16, the dashed lines represent waveforms in the first element portion 10, and the solid lines represent waveforms in the second element portion 12. From the waveforms of the turn-off losses Eoff shown in FIG. 16, it can be appreciated that most of the turn-off loss of the semiconductor device is incurred in the second element portion 12. The reason for this is that since the first element portion 10 is turned off before the second element portion 12 is turned off, the current in the semiconductor element flows entirely through the second element portion 12, instead of flowing through both the first and second element portions 10 and 12, after the turning off of the first element portion 10.

In the case of the semiconductor device of the fourth embodiment, although most of the turn-off loss of the device occurs in the second element portion 12, the turn-off loss of the second element portion 12 is relatively small since the second element portion 12 is designed in accordance with the high-speed specification. This makes it possible to reduce the switching loss of the entire semiconductor device.

In the semiconductor element of the fourth embodiment, the impurity concentration in the second collector layer 40b is selected to be lower than that in the first collector layer 40a. It is to be understood, however, that other techniques may be used to form element portions that meet the low-speed specification and the high-speed specification. For example, it is possible to form element portions that meet the low-speed specification and the high-speed specification by suitably selecting the gate distance, the channel length, the thickness or the impurity concentration of the buffer layer, or the thickness of the collector layer therein.

Figure 17:
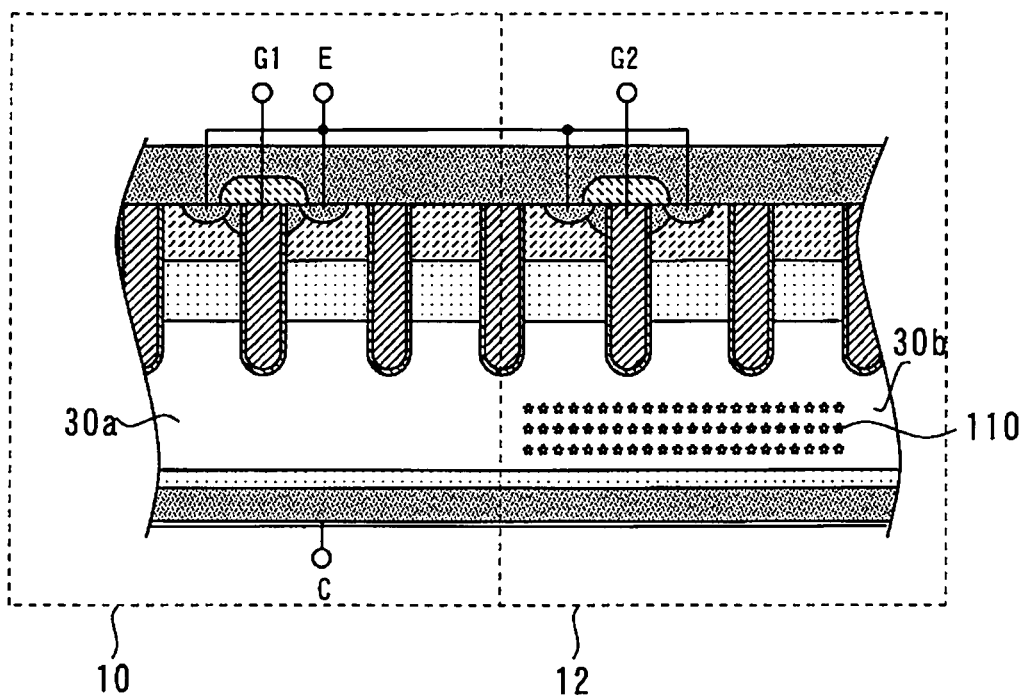
FIG. 17 is a diagram showing lifetime killers formed in an n-layer in order to control the lifetime of carriers.

FIG. 17 is a diagram showing lifetime killers formed in an n⁻-layer in order to control the lifetime of carriers. Specifically, lifetime killers 110 are formed in the n⁻-layer 30b of the second element portion 12. The lifetime killers 110 are formed by introduction of Au or Pt, or by electron beam irradiation.

The lifetime killers 110 act so that the minority carriers in the second element portion 12 has a shorter lifetime than the minority carriers in the first element portion 10. As a result, the switching speed of the second element portion 12 can be designed to be higher than that of the first element portion 10.

It should be noted that lifetime killers can also be formed in the n⁻-layer 30a of the first element portion 10 as long as the lifetime killer density in the first element portion 10 is lower than that in the second element portion 12. That is, the advantages of the present invention can be obtained if the density of carrier lifetime killers in the second element portion 12 is higher than that in the first element portion 10. Further, the semiconductor element of the fourth embodiment is susceptible of at least alterations similar to those that can be made to the semiconductor element of the first embodiment.

Fifth Embodiment

Figure 18:
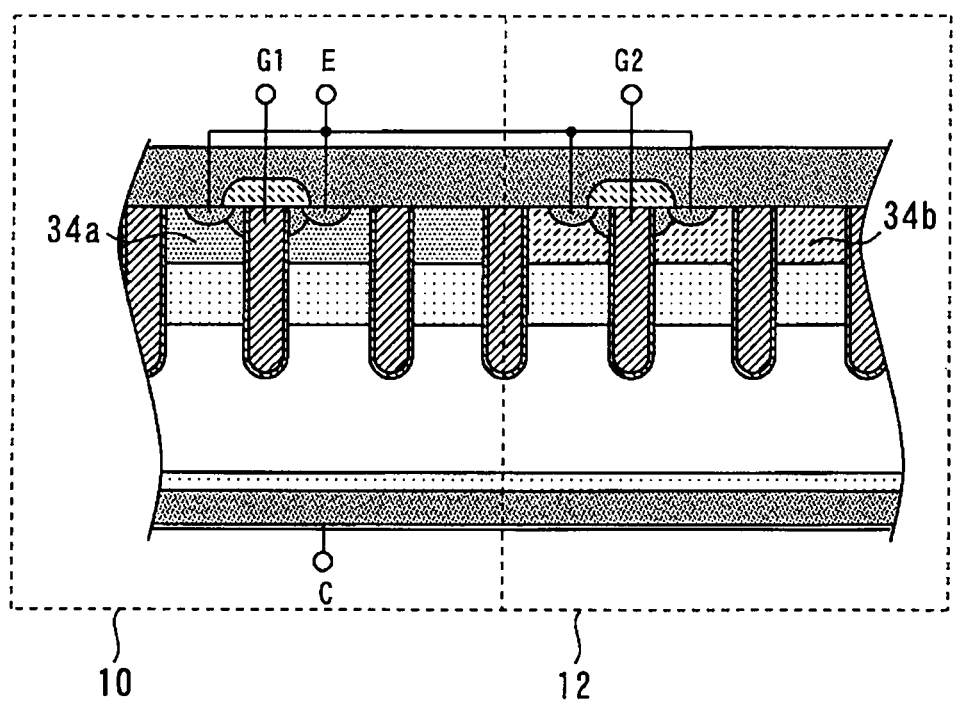
FIG. 18 is a cross-sectional view of the semiconductor element of the fifth embodiment.

A semiconductor element in accordance with a fifth embodiment of the present invention is characterized in that the first and second element portions have different threshold voltages. FIG. 18 is a cross-sectional view of the semiconductor element of the fifth embodiment. The same signal is transmitted to the first gate G1 and the second gate G2.

The first element portion 10 is formed to have a first threshold voltage. Further, the second element portion 12 is formed to have a second threshold voltage higher than the first threshold voltage. The difference between these threshold voltages is created by selecting the impurity concentration of a channel layer 34a to be lower than that of a channel layer 34b.

In the semiconductor element of the fifth embodiment, it is possible to delay the drive of the second element portion 12 with respect to the first element portion 10 while applying the same signal to the first gate (G1) and the second gate (G2). More specifically, the second element portion 12 can be turned off a delay time after the first element portion 10 is turned off, resulting in reduced switching loss of the semiconductor element. Further, since the same signal can be applied to the first element portion 10 and the second element portion 12, it is possible to simplify the signal transmission means.

In the semiconductor element of the fifth embodiment, the impurity concentrations of the channel layers are adjusted so that the first and second element portions to have different threshold voltages. It is to be understood, however, that the present invention is not limited to this particular feature. In order to achieve the advantages of the present invention, the semiconductor element only needs to be provided with: a first element portion which receives a signal on its gate and performs on-off control; and a second element portion which also performs on-off control in accordance with the same signal and whose operation is delayed with respect to the first element portion.

FIG. 19 is a diagram showing a variation of the semiconductor element of the fifth embodiment. The gate oxide film 39a of the first element portion 10 is formed to have a smaller thickness than the gate oxide film 39b of the second element portion 12. As a result, the turning off of the second element portion 12 can be delayed with respect to the first element portion 10.

Sixth Embodiment

A semiconductor element in accordance with a sixth embodiment of the present invention is characterized in that the first and second element portions have different RC time constants. FIG. 20 is a cross-sectional view of the semiconductor element of the sixth embodiment. The same signal is transmitted to the first gate (G1) and the second gate (G2).

The polysilicon gates 36a and the polysilicon gates 36b are formed of different materials. As a result, the second element portion 12 has a higher gate resistance than the first element portion 10. Further, the amount of impurity in the base layer 32a of the first element portion 10 is less than that in the base layer 32b of the second element portion 12. Further, the amount of impurity in the channel layer 34a is less than that in the channel layer 34b. Therefore, the second element portion 12 has a higher internal capacitance than the first element portion 10.

As a result, the first element portion 10 has a first RC time constant, and the second element portion 12 has a second RC time constant higher than the first RC time constant.

This makes it possible to delay the switching of the second element portion 12 with respect to the first element portion 10. Thus, the second element portion 12 can be turned off a delay time after the first element portion 10 is turned off, resulting in reduced switching loss of the semiconductor element. Further, since the same signal can be applied to the first element portion 10 and the second element portion 12, it is possible to simplify the signal transmission means.

In all embodiments described above, the semiconductor element is an IGBT, which is a minority carrier (bipolar) device. It is to be understood, however, that the semiconductor element of each embodiment may be a majority carrier (unipolar) device such as a MOSFET. Since majority carrier devices have fast switching speed, they are expected to exhibit lower switching loss than minority carrier devices.

The semiconductor element may be formed of silicon, or alternatively may be formed of a wide bandgap semiconductor having a wider bandgap than silicon. Examples of wide bandgap semiconductors include silicon carbide, gallium nitride-based materials, and diamond.

In accordance with the present invention there is provided a semiconductor device wherein a plurality of element portions are sequentially turned off, making it possible to reduce the switching loss of the semiconductor device.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2011-106529, filed on May 11, 2011 including specification, claims, drawings and summary, on which the Convention priority of the present application is based, are incorporated herein by reference in its entirety.

What is claimed is:

1. A semiconductor device comprising:
   a semiconductor element including a first element portion having a first gate and a second element portion having a second gate, wherein the turning on and off of said first element portion is controlled by a signal from said first gate, and wherein the turning on and off of said second element portion is controlled by a signal from said second gate; and
   signal transmission circuitry connected to said first gate and said second gate and configured to transmit a signal to said first gate and said second gate so that when said semiconductor element is to be turned on, said first element portion and said second element portion are simultaneously turned on, and so that when said semiconductor element is to be turned off, said second element portion is turned off a delay time after said first element portion is turned off, wherein
   said second element portion is formed to surround said first element portion.

2. The semiconductor device according to claim 1, wherein said second element portion is larger in area than said first element portion.

3. The semiconductor device according to claim 1, wherein said second element portion is adapted to have a higher switching speed than said first element portion.

4. The semiconductor device according to claim 3, wherein:
   said semiconductor element is a conductivity modulation type semiconductor element in which carriers are injected from collector layers into a drift layer;
   said first element portion has a first collector layer formed therein;
   said second element portion has a second collector layer formed therein; and
   said second collector layer has a lower impurity concentration than said first collector layer.

5. The semiconductor device according to claim 3, wherein carrier lifetime killers are formed in said second element portion, and the density of carrier lifetime killers in said second element portion is higher than that in said first element portion.

6. The semiconductor device according to claim 1, wherein said semiconductor element has a sense pad formed thereon.

7. The semiconductor device according to claim 1, wherein said semiconductor element is formed of a wide bandgap semiconductor.

8. The semiconductor device according to claim 7, wherein said wide bandgap semiconductor is silicon carbide, gallium nitride-based material, or diamond.

* * * * *